United States Patent [19]

McKee et al.

[11] Patent Number: 5,225,031

[45] Date of Patent: Jul. 6, 1993

[54] PROCESS FOR DEPOSITING AN OXIDE EPITAXIALLY ONTO A SILICON SUBSTRATE AND STRUCTURES PREPARED WITH THE PROCESS

[75] Inventors: Rodney A. McKee, Kingston; Frederick J. Walker, Oak Ridge, both of Tenn.

[73] Assignee: Martin Marietta Energy Systems, Inc., Oak Ridge, Tenn.

[21] Appl. No.: 683,401

[22] Filed: Apr. 10, 1991

[51] Int. Cl.$^5$ .............................................. C30B 25/14
[52] U.S. Cl. .................................... 156/612; 156/610; 156/611; 156/DIG. 64; 156/DIG. 78; 156/DIG. 89; 427/255; 148/33
[58] Field of Search ....... 156/610, 611, 612, DIG. 64, 156/DIG. 78, DIG. 89; 427/255, 255.3; 148/33

[56] References Cited

U.S. PATENT DOCUMENTS

| | | | |
|---|---|---|---|
| 3,645,788 | 2/1972 | Mee et al. | 156/614 |
| 3,850,679 | 11/1974 | Sopko et al. | 427/255.3 |
| 4,509,990 | 4/1985 | Vasudev | 437/24 |
| 4,592,927 | 6/1986 | Stall | 427/255.3 |
| 4,927,670 | 5/1990 | Erbil | 427/255.3 |

OTHER PUBLICATIONS

McKee et al., "Molecular Beam Epitaxy Growth of Epitaxial Barium Silicide, Barium Oxide, . . . On Silicon", Appl. Phys. Lett. 59(7) Aug. 12, 1991 pp. 782-784.

Primary Examiner—Robert Kunemund
Attorney, Agent, or Firm—George L. Craig; Michael E. McKee; Harold W. Adams

[57] ABSTRACT

A process and structure involving a silicon substrate utilizes an ultra high vacuum and molecular beam epitaxy (MBE) methods to grow an epitaxial oxide film upon a surface of the substrate. As the film is grown, the lattice of the compound formed at the silicon interface becomes stabilized, and a base layer comprised of an oxide having a sodium chloride-type lattice structure grows epitaxially upon the compound so as to cover the substrate surface. A perovskite may then be grown epitaxially upon the base layer to render a product which incorporates silicon, with its electronic capabilities, with a perovskite having technologically-significant properties of its own.

19 Claims, 5 Drawing Sheets

BaO on Si(100) -- [100] zone axis

BaO on Si(100) -- [110] zone axis

BaTiO$_3$ on BaO(100) -- [100] zone axis

BaTiO$_3$ on BaO(100) -- [110] zone axis

PROCESS FOR DEPOSITING AN OXIDE EPITAXIALLY ONTO A SILICON SUBSTRATE AND STRUCTURES PREPARED WITH THE PROCESS

BACKGROUND OF THE INVENTION

This invention was made with Government support under Contract No. DE-AC05-84OR21400 awarded to Martin Marietta Energy Systems, Inc. and the Government has certain rights in this invention.

This invention relates generally to the preparation of structures utilizing a silicon substrate and relates more particularly to the formation of thin films upon a silicon substrate.

Heretofore, the growth of epitaxial oxide materials on a silicon surface has been hindered by the tendency for amorphous silica, e.g., SiO or $SiO_2$, or other glassy silicates to form at the silicon surface upon exposure of the silicon surface to oxygen. The amorphous form of such silicates interrupts and blocks the interface structural coherence that is required for the growth of epitaxial oxide layers upon the silicon surface.

It would therefore be desirable to provide a process which prevents the formation of amorphous silicates upon a silicon surface and builds upon the silicon surface an epitaxial layer whose crystalline structure interfaces with that of the silicon. With the epitaxial layer covering the silicon surface, the formation of amorphous silicates at the silicon surface is prevented and additional materials, such as oxides in a class of oxides known as perovskites, may be grown epitaxially in films upon the silicon surface. Since perovskites exhibit technologically-significant properties, such as ferroelectricity, piezoelectricity, superconductivity and nonlinear electro-optic behavior, a process which accommodates the epitaxial growth of a pervoskite film onto silicon may lead to the development of devices which complement the capabilities of electronics.

It is accordingly an object of the present invention to provide a process for growing an epitaxial layer of an oxide upon a silicon substrate.

Another object of the present invention is to provide such a process wherein the crystalline structure of the growth layer interfaces with that of the silicon at the surface of the substrate.

Still another object of the present invention is to provide such a process which prevents the formation of amorphous silicates at the surface of the substrate.

Yet another object of the present invention is to provide a structure prepared with the process of this invention and upon which perovskite films can be grown.

A further object of the present invention is to provide a structure prepared with the process of this invention and which includes a perovskite film.

SUMMARY OF THE INVENTION

This invention resides in a process for growing an epitaxial oxide having a sodium chloride-type lattice structure onto a silicon substrate and structures prepared with the process.

The process of the invention includes the steps of developing an ultra high vacuum, oxygen-free environment about a silicon substrate having a surface which has been cleaned to atomic cleanliness and raised to a high temperature. An amount of a metal from a flux source of the metal is then deposited upon the substrate surface until a fraction of a monolayer of the metal covers the substrate surface while maintaining the environment of the silicon substrate oxygen-free and at a high temperature so that a submonolayer of a silicide which is epitaxially matched to that of silicon is formed at the metal/silicon interface. The temperature of the substrate is thereafter lowered to between about 200° to 300° C., and an additional amount of the metal from the flux source is deposited upon the substrate surface until the substrate surface is covered by one monolayer of the metal.

Without exposing the metal-covered surface, the pressure of the high vacuum environment is raised to a target pressure of between about $1 \times 10^{-6}$ torr and $5 \times 10^{-6}$ torr with the introduction of oxygen and an additional amount of the metal from the flux source is introduced into the high vacuum environment necessary to deposit the metal upon the substrate surface at a predetermined rate. Upon reaching the target pressure, the metal-covered surface is exposed to the oxygen and metal within the high vacuum environment so that epitaxial oxide begins to grow upon the substrate surface. The epitaxial oxide is continued to be built-up upon the substrate in a layered fashion by cyclically exposing the metal-covered substrate surface to additional amounts of the metal from the flux source and oxygen. With the oxide covering the substrate surface, the surface is in condition for the epitaxial growth of a perovskite film thereon with molecular beam epitaxy procedures.

In one embodiment of the structure of the invention, including a substrate of silicon, the structure includes a monolayer of a metal epitaxially covering the surface of the silicon substrate and a film of an oxide epitaxially covering the metal-covered substrate surface wherein the film includes additional layers of the metal combined with oxygen. If desired, the oxide film which covers the metal-covered substrate surface may be epitaxially covered with a layer of perovskite to render a further embodiment of the structure of the invention.

DETAILED DESCRIPTION OF AN ILLUSTRATED EMBODIMENT

Figure 1:
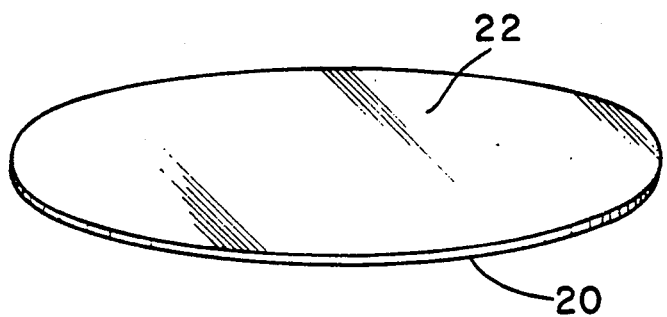
FIG. 1 is a perspective view of a silicon wafer upon which an epitaxial film of BaO may be grown in accordance with the method of the present invention.

With reference to FIG. 1 there is illustrated a silicon wafer or substrate 20 having a surface 22 over which an epitaxial film of BaO can be grown in accordance with the process of the present invention. With the BaO film covering the silicon surface 22, a layer of a perovskite, such as $BaTiO_3$, can be grown epitaxially over the BaO film. Due to optical properties of $BaTiO_3$, the $BaTiO_3$ layer may serve as a waveguide for conducting light across the surface of the substrate 20 so that the multi-layered structure incorporating $BaTiO_3$, BaO and silicon may be suited for integrating electronic circuits and light sources in electronic/optical applications.

Figure 2:
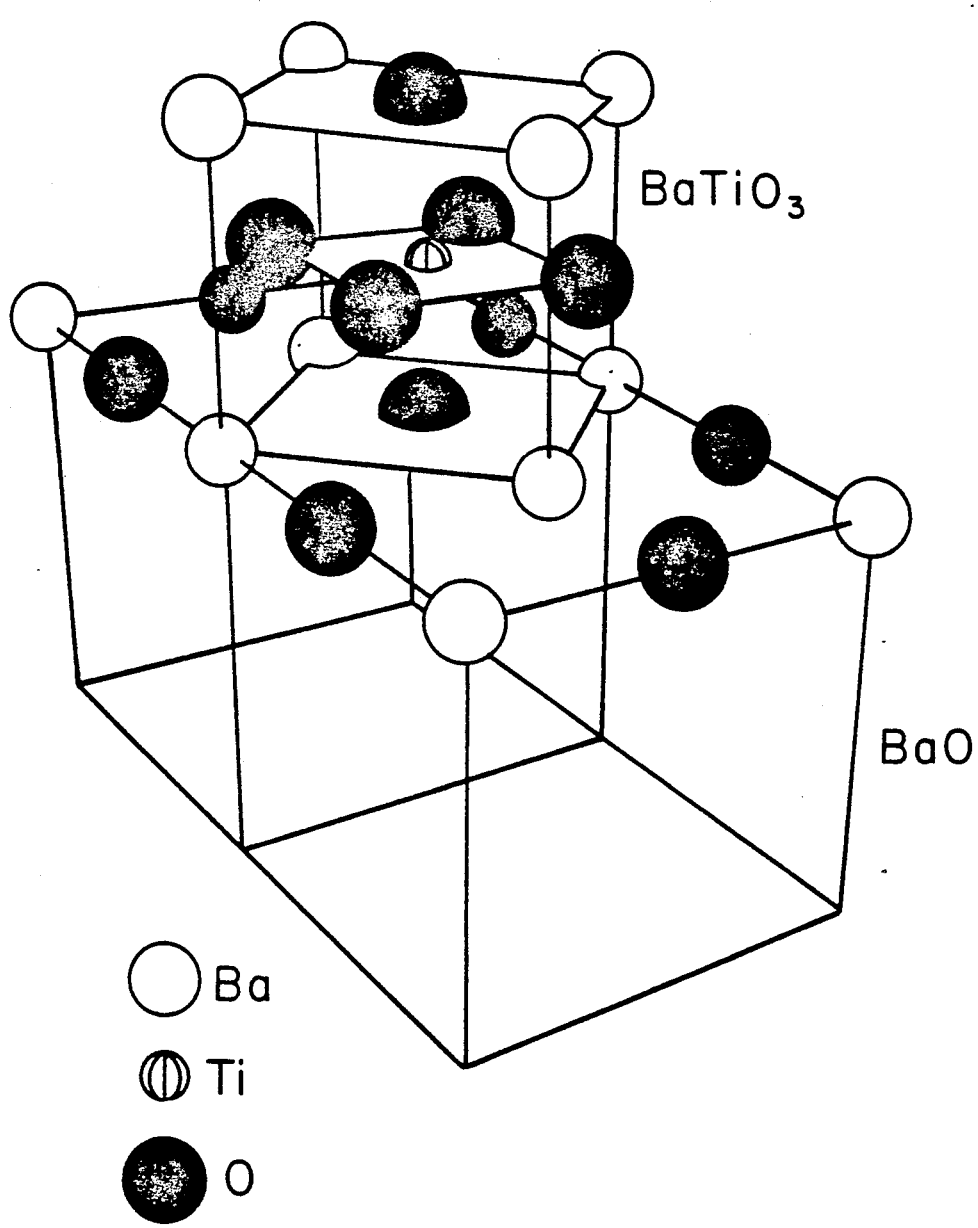
FIG. 2 is a perspective view of a fragment of an idealized $BaO/BaTiO_3$ model.

As will be apparent herein, the process of the present invention takes advantage of the excellent lattice matching that exists between BaO and silicon and between $BaTiO_3$ and BaO. The lattice structures of these substrances are cubic and possess lattice parameters of 0.543, 0.552 and 0.401 nm for silicon, BaO and $BaTiO_3$, respectively. With reference to FIG. 2, there is shown a fragment of an idealized model of BaO, which has the NaCl structure, truncated with the pervoskite variation that occurs when every other BaO plane is replaced with a $TiO_2$ plane. The resulting $BaTiO_3$ is rotated 45 degrees on the (001) of BaO so that a <100> direction in $BaTiO_3$ is parallel with a <110> in BaO. The 0.401 nm cell constant for $BaTiO_3$ is within 1% of the 0.393 nm <110> planar spacing of BaO. While the idealized model of FIG. 2 guided the development of the process described herein, it has been found that interfacial reactions must be systematically controlled in order that film growth not be interrupted.

At the outset of a process performed with the present invention, the surface 22 of the silicon substrate 20 is cleaned to atomic cleanliness so that only silicon atoms are present at the surface 22. To this end, the surface 22 is cleaned by a process commonly referred to as a Modified RCA technique. The Modified RCA technique is a well-known process involving the chemical production of an oxide at a silicon surface being cleaned and subsequently placing the surface in a high vacuum environment and raising the temperature of the surface to sublime the oxide off of the surface.

Figure 3:
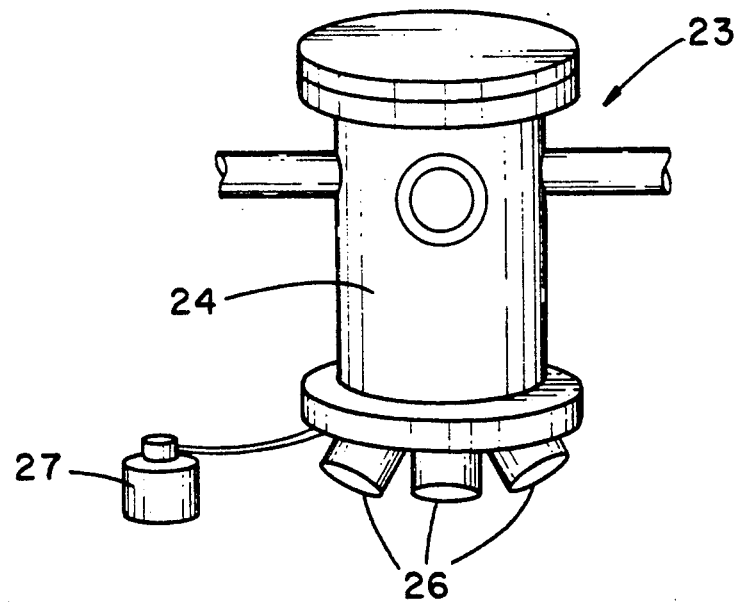
FIG. 3 is a schematic perspective view of a fragment of the ultra high vacuum equipment within which the steps of the process of the present invention may be performed.

The equipment used for creating a high vacuum environment about the substrate 20 is an ultra high vacuum (UHV) growth/characterization facility, a fragment of which is indicated 23 in FIG. 3. The facility 23 includes a container 24 having an inner chamber within which the substrate 20 is positioned so that its surface 22 faces downwardly, and a plurality of canisters 26 are mounted within the base of the container 24 for providing a vapor source of metals desired to be added to the substrate surface 22 during the process of the present invention. In this connection, each canister 26 is adapted to hold a crucible containing a desired metal and contains heating elements for vaporizing the metal. An opening is provided in the top of each canister 26, and a shutter is associated with the canister opening for movement between a closed condition at which the interior of the container 24 is closed and thereby isolated from the substrate surface 22 and an opened condition at which the contents of the container 24, i.e., the metal vapor, is exposed to the substrate surface 22. In addition, an oxygen source 27 is connected to the chamber so that by opening and closing a valve associated with the source 27, oxygen may be delivered to or shut off from the chamber. The opening and closing of each canister shutter and the oxygen source valve is accurately controlled by a computer controller (not shown).

One other feature of the facility 23 is that a closable substrate shutter is disposed immediately below the downwardly-directed face of the substrate surface 20 for isolating, when desired, the substrate surface 20 from exposure to the metal vapors from the canisters 24 or the oxygen from the oxygen source 27 while the internal pressure of the facility chamber is raised with the oxygen from the source 27. The substrate shutter is closed during one step of the present process as will be apparent herein.

The vacuum drawn in the UHV facility 23 to complete the Modified RCA cleaning technique upon the substrate 20 is between about $10^{-9}$ and $10^{-10}$ torr, and the substrate 20 is heated to raise the substrate temperature to a temperature sufficient to drive the oxides off of the surface 22. In practice, such a temperature may be between about 850° and 1050° C., and the desired surface cleanliness may be confirmed in-situ during the substrate heating operation by Reflection High Energy Electron Diffraction (RHEED) techniques. Briefly, a RHEED technique uses a high energy electron beam to diffract electrons off the substrate surface 22 at a glancing angle, typically 10 keV at an incidence angle of 1 to 2 degrees. The diffraction of the electrons provides crystallographic information while the limited penetration of the electron beam provides information relating to the flatness of the film surface. A flat surface is characterized by rods of scattered intensity perpendicular to the film intersecting the normal Bragg reflections of the crystal structure. For present purposes, the silicon substrate 20 reaches atomic cleanliness upon the development of $2 \times 1$ Si(100) at the surface 22 as evidenced by RHEED analysis.

At that point, Barium (Ba) metal is deposited upon the substrate surface 22 so that a fraction, e.g. about one-fourth, of a monolayer covers the substrate surface 22. In other words, Ba metal is deposited upon the substrate surface 22 until about one atom of Ba overlies the silicon surface 22 for every four atomic sites of Si. To this end, Ba vapor is created in one of the canisters 24 (FIG. 3) and the canister shutter is opened to expose the clean substrate surface 22 to the Ba vapor. As mentioned earlier, the operation of the canister shutter is controlled by a computer controller to accurately control the amount of Ba metal deposited upon the surface 22. Once the exposure of the substrate surface 22 to the Ba metal is sufficient to provide the desired fraction of the monolayer of Barium, the canister shutter is closed.

The substrate 20 is then cooled to about 200°–300° C. while the high vacuum environment is maintained about the substrate 20, and the remainder of one monolayer of Ba is then deposited upon the substrate surface 22. To this end, the shutter of the Barium-containing canister 26 is opened for an appropriate period of time. It has been found that the cooling of the substrate 20 to the lower temperature (i.e. 200°–300° C.) promotes the attachment of the Ba atoms to the substrate surface 20 because the added Ba atoms remain in a metallic state and do not form silicide at these lower temperatures and below.

An important step in the epitaxial oxide growth on silicon is the stabilization of a lattice and symmetry matched barium-silicon compound at the BaO/Si interface. It is known that the cubic polymorph (i.e., a high pressure) form of $BaSi_2$ contains the basic units for a "template" surface for BaO growth. Cubic $BaSi_2$ adopts the $SrSi_2$ structure in which the metal atoms are in an 8-fold coordinated silicon bipyramid. The unit cell has four molecules, and a projection of one molecular unit onto the cube face results in a slight distortion of a face centered barium net. Heretofore, however, the development of such template structures have relied primarily upon low temperature deposition of relatively thick disordered films followed by high temperature reaction for nucleation and growth of the template structures. In contrast, the process of the present invention is believed to involve an interruption at submonolayer coverages permitting epitaxial strain to stabilize ordered surface structures.

More specifically, the step of the present process involving the depositing of an amount of Ba equivalent to a fraction (i.e., about one-fourth) of a monolayer of Ba onto the Si surface results in the formation of the cubic polymorph of $BaSi_2$ which is epitaxially matched to silicon. The strong bond which develops between the Si and Ba atoms at the Ba/Si interface is believed to provide the pressure needed to retain the $BaSi_2$ form in its cubic polymorph.

In order that the desirable structure of $BaSi_2$, rather than the structure of BaSi, be grown between the barium and silicon as a simple surface reaction, the temperature of the substrate 20 at which the one-fourth monolayer of Ba is deposited upon the Si surface is maintained above 840° C. To deposit the Ba upon the Si surface at a lower temperature may result in a BaSi lattice structure which is not suited for subsequent growth of BaO.

Although phase diagrams may be referred to for formation of $BaSi_2$ at a temperature lower than 840° C. by controlling other parameters, e.g. chamber pressure, at the Si surface to ensure that $BaSi_2$ is formed upon the Si surface with the UHV environment described herein, i.e., between $10^{-9}$ and $10^{-10}$ torr, the temperature of the silicon substrate 20 is lowered to no less than about 850° C. before exposure of the clean substrate surface 22 to the Ba metal.

A model based on barium atoms ordering into chains along the <110> directions of the underlying silicon lattice is believed to aid in the explanation of the aforedescribed submonolayer transitions and the RHEED observations from the surface. In this connection, FIG. 4 includes a graph representing intensity versus coverage data accumulated for the (0,0), ($\frac{1}{3}$, 0) and ($\frac{1}{2}$, 0) rods of RHEED from the (001) silicon surface at a <110> zone axis. These data were obtained by digitizing RHEED screen images collected with a video camera. The dashed line indicated C and D denote maxima in the specularly reflected (0,0) rod that occur at coverages of 1/6 and $\frac{1}{4}$ monolayers (ML, 1 ML=$6.78 \times 10^{14}$ atoms/cm$^2$). These maxima in the specular beam occur as the surface flattens when the ordered surface structures are complete. The other two curves in FIG. 4, the ($\frac{1}{3}$, 0) and ($\frac{1}{2}$, 0) rod intensities, provide data that describe structural evolution as opposed to the surface morphological information contained in the specular rod.

Figure 4:
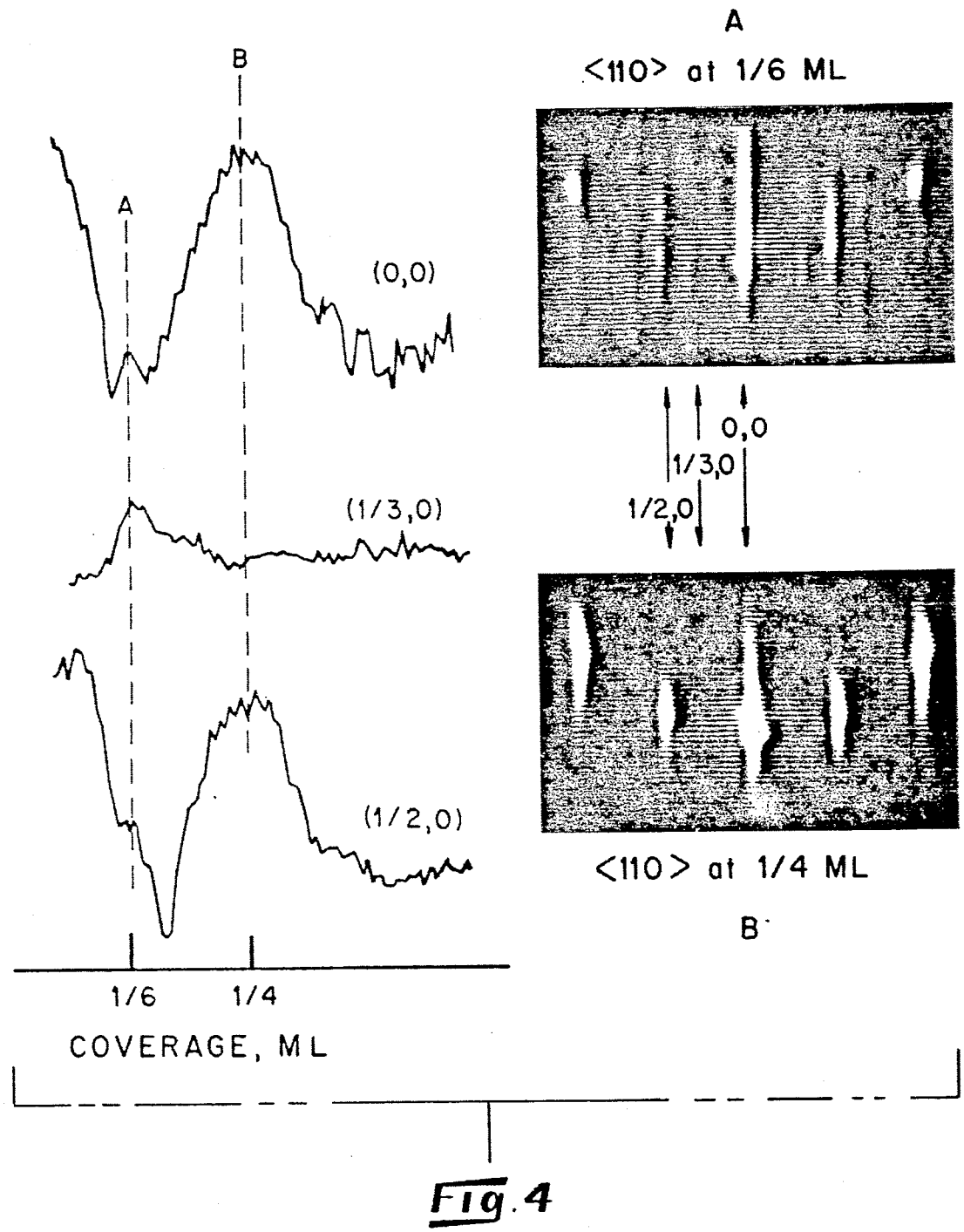
FIG. 4 includes graphs and photographs providing Reflection High Energy Electron Diffraction (RHEED) data for $BaSi_2$ formation on the (001) surface of silicon.

The ($\frac{1}{3}$, 0) rod intensity experiences a maximum at 1/6 ML, and the diffraction pattern, indicated photo A in FIG. 4, shows the lattice parameter tripling. This intermediate state decomposes as barium deposition continues, but at $\frac{1}{4}$ ML, the ($\frac{1}{2}$, 0) rod goes through a strong maximum, and the diffraction pattern, indicated photo B in FIG. 4, shows a highly ordered 2×1 surface. If barium deposition is continued, the 2×1 surface collapses to the orthorhombic bulk $BaSi_2$ for coverages greater than one ML. X-ray photoelectron spectroscopy (XPS) analyses of both the 3× and 2× surfaces show that the Ba-3d photoelectron peak and the X-ray excited Auger transitions are shifted to $BaSi_2$ states relative to a barium metal standard. The 2×1 surface obtained at $\frac{1}{4}$ monolayer coverage provides the template that can be used to grow BaO epitaxially on silicon.

Once formed, the 2×1 barium silicide surface, when cooled to 200° C. or below, will support free barium metal that does not react to form the silicide.

With the stable, submonolayer silicide at the interface of the Ba and Si at the silicon surface, BaO may be grown epitaxially upon the silicon. To this end, the substrate shutter is closed to prevent exposure of the substrate surface 20 to the facility chamber contents, and the pressure of the chamber is raised to about $1-5 \times 10^{-6}$ torr of oxygen while maintaining a Ba vapor source operation that would be needed to deposit barium metal upon the substrate surface at a predetermined rate, i.e., between 0.01 nm/sec and 0.05 nm/sec. Upon reaching the target oxygen pressure, e.g., $1 \times 10^{-6}$ torr, the substrate shutter is opened to expose the Bariumcoated surface of the substrate to oxygen and additional Barium atoms. Upon such exposure, BaO begins to grow epitaxially upon the Barium-coated surface.

By appropriately opening and closing off the exposure of the substrate surface to the Ba metal and oxygen by cyclically exposing the substrate surface to the Ba metal and oxygen, BaO is grown upon the substrate surface one monolayer at a time. Such a growth pattern is continued until the monolayers of BaO develop sufficient stability to prevent the formation of an amorphous silicate. It has been found that such stability may be achieved upon the formation of a BaO thickness of about 2.28 nm (equivalent to about 40 cell units high). If desired, the substrate temperature may be raised after the formation of about five monolayers of BaO to increase the mobility of the atoms at the site of the monolayer being formed and to thereby increase the growth rate of the monolayer. However, the growth rate and the thickness of the BaO film desired may depend largely upon the application in which the resulting structure is to be used. Therefore, the ultimate application may dictate the temperatures and growth rates chosen for the BaO film growth.

BaO has been grown upon the substrate surface at rates from 0.001 nm/sec to 0.3 nm/sec, from room temperature to 800° C., in oxygen pressures ranging from $10^{-7}$ to $10^{-4}$ torr and under cyclic barium/oxygen arrival at the growing oxide surface. In-situ ellipsometry measurements of the index of refraction for the epitaxial BaO gave n=1.96, within 10% of the 1.98 value for the bulk phase.

Figure 5:
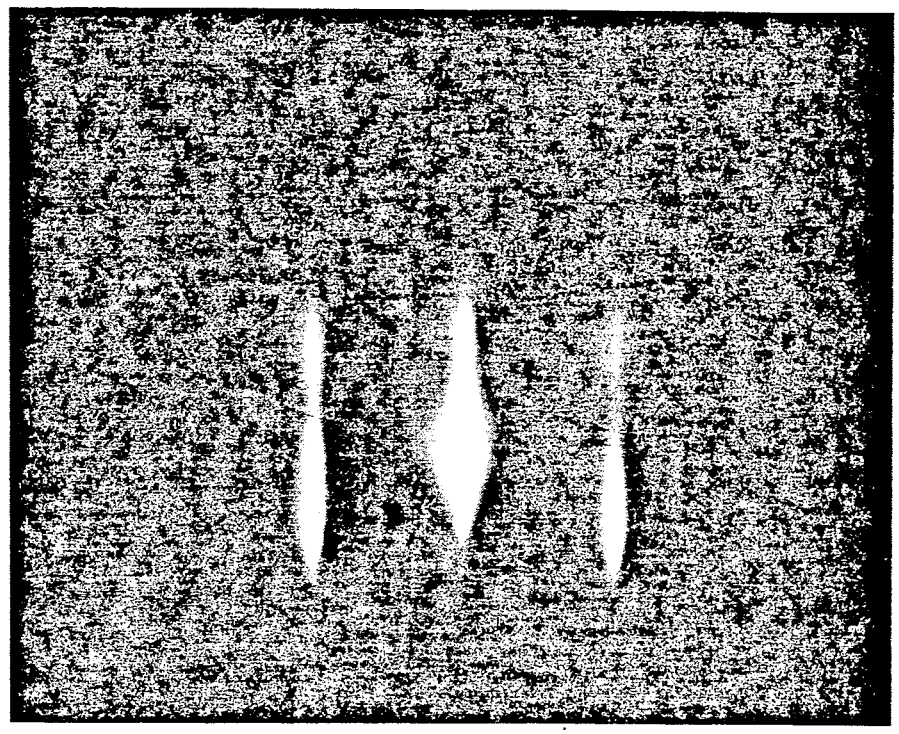
FIGS. 5 and 6 are photographs providing RHEED patterns at different rotations of the beam relative to the surface of the silicon upon which BaO has been grown.
Figure 6:
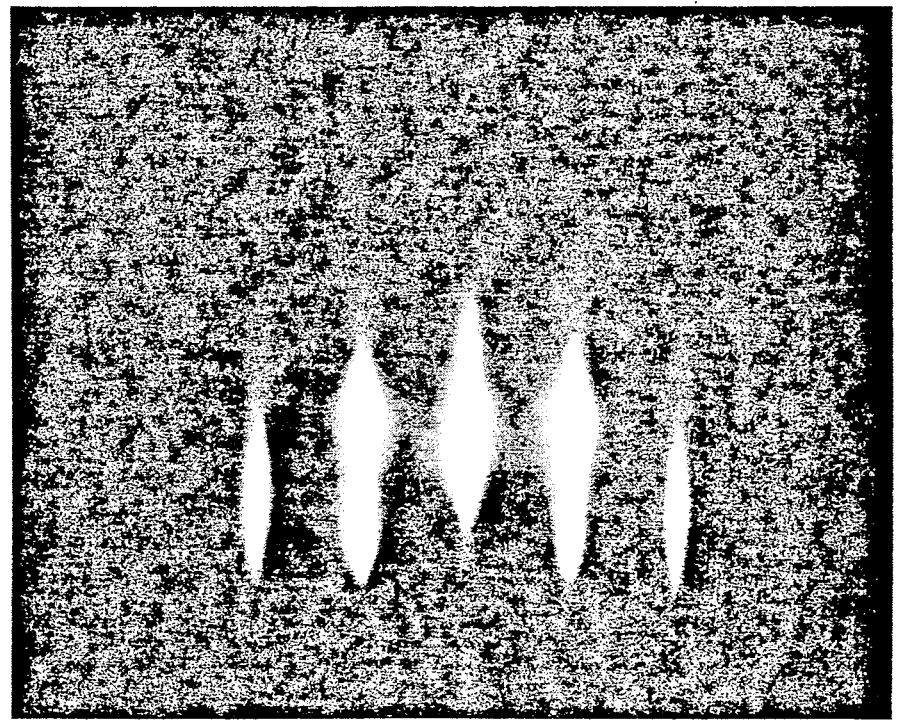

FIGS. 5 and 6 are RHEED photographs illustrating epitaxial growth characteristics and quality of a BaO film which is about 100 nm thick. The photographs were obtained at different rotations of an electron beam relative to the surface normal. More specifically, FIG. 5 illustrates RHEED patterns of BaO on the (100) face of Si obtained along a direction corresponding with the [100] zone axis. Similarly, FIG. 6 illustrates RHEED patterns of BaO on the (100) face silicon obtained along a direction corresponding with the [110] zone axis. Such results indicate a sodium chloride crystal structure of the BaO film wherein the (100) planes of BaO have grown parallel to the (100) planes of silicon. Such a result is expected based upon the good lattice matching of BaO (a=0.554 nm) and Si (a=0.543 nm). Moreover, and as indicated by the rods of defracted intensity, the surface morphology is very flat. Such flatness is important for layered applications wherein a sharp interface between the layers is required.

With the BaO layer grown epitaxially upon the silicon substrate, BaTiO$_3$ may then be grown upon the BaO-covered substrate in accordance with the process of the present invention. BaO and BiTiO$_3$ do not coexist in a simple two-phase equilibrium but are separated by the intermediate orthotitinate, Ba$_2$TiO$_4$. Therefore, a simple interface between BaO and BaTiO$_3$ as depicted in the model of FIG. 2 cannot be realized. However, a stacking fault in BaTiO$_3$ where the (001) plane of BaO is repeated twice followed by the TiO$_2$ plane would result in a body-centered tetragonal structure with the Ba$_2$TiO$_4$ stoichiometry. Such planar stacking leads to the K$_2$NiF$_4$ structure.

Although the exact nature of the interface between BaO and BaTiO$_3$ is not clear at this time, the orthotitanate reaction can be limited to a few atomic planes. Such an interface does not destroy the expected epitaxy between BaO and BaTiO$_3$. For example, a BaTiO$_3$ film having a thickness of 25 nm has been grown upon the BaO-covered substrate by shuttering titanium and Barium cells as one monolayer intervals in an oxygen pressure of $2.5 \times 10^{-7}$ torr, and RHEED analysis performed upon the film verified that the expected epitaxy between BaO and BaTiO$_3$ was not destroyed. As a matter of interest, elipsometry measurements of the index of refraction for the titanate on top of 100 nm of BaO gave n=2.2 (the index of refraction for bulk BaTiO$_3$ is 2.4).

By way of example, the following shuttering sequence has been followed to grow BaTiO$_3$ upon the BaO-covered substrate surface. With the high vacuum environment maintained at about $2.5 \times 10^{-7}$ torr and a reactively high temperature, e.g., about 600° C., the appropriate canister shutter is opened to introduce titanium to the chamber environment and open the valve to the oxygen source so that the BaO-covered substrate is exposed to both titanium and oxygen. When the substrate has been exposed to the titanium for a sufficient period of time, e.g., between 3 and 10 seconds, needed to deposit one monolayer of titanium upon the substrate surface, the titanium shutter is closed. About ten seconds is permitted to lapse (to permit the titanium and oxygen to stabilize upon the BaO-covered substrate surface) and then the titanium shutter is reopened for a sufficient period of time needed to deposit another monolayer of titanium upon the substrate surface. The titanium shutter is closed at the end of this period, and about ten seconds are again permitted to lapse. The appropriate canister shutter is then opened to expose Barium to the substrate surface (in the presence of oxygen) for a period of time normally sufficient to deposit one monolayer of barium upon the substrate. The barium shutter is subsequently closed, and the titanium and barium shutters are thereafter opened and closed in an alternating fashion with a delay of a few seconds therebetween. The result of such a shuttering sequence builds up BaTiO. upon the BaO-covered substrate surface in one-layer intervals. The aforedescribed sequencing of the barium and titanium shutters is continued until the desired thickness of BaTiO$_3$ is obtained.

Figure 7:
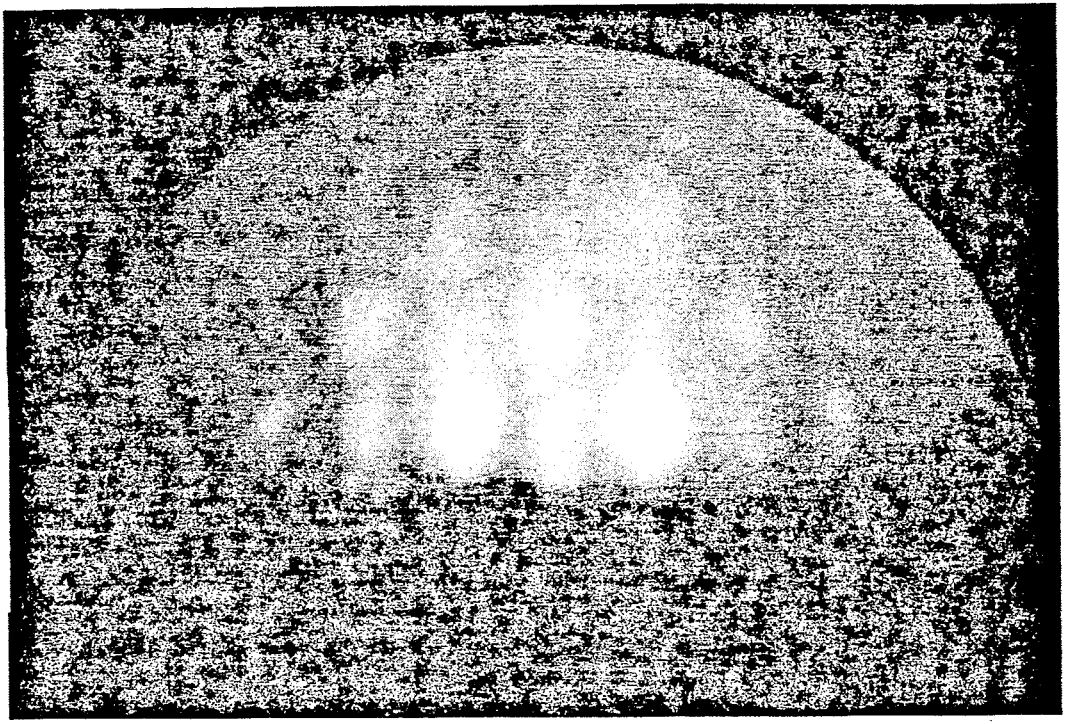
FIGS. 7 and 8 are photographs providing RHEED patterns at different rotations of the beam relative to the BaO surface upon which $BaTiO_3$ has been grown.
Figure 8:
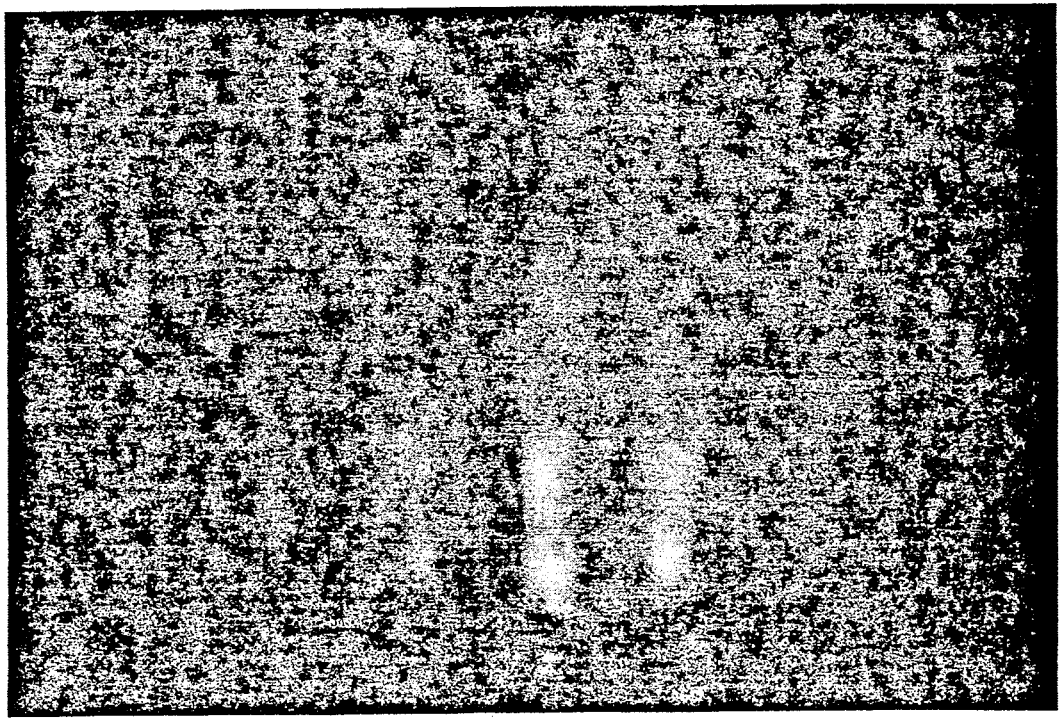

The lattice constant for cubic BaTiO$_3$ is 0.401 nm, and for the [100] growth normal of the BaO compound, a 45 degree rotation of the titanate to the oxide gives a good lattice match for the (110) planar spacing of BaO at 0.391 nm. Hence, epitaxial growth of the BaTiO$_3$ upon the BaO is effected by the MBE technique discussed herein, and the RHEED photographs provided in FIGS. 7 and 8 substantiate this epitaxial growth. The epitaxy in FIGS. 7 and 8 are specified, respectively, as BaO (100)//BaTiO$_3$(100) and BaO<110>//BaTiO$_3$<100>.

The layered structure of BaTiO$_3$, BaO and the silicon substrate may be utilized in an electronic/optical device wherein the BaTiO$_3$ provides a waveguide and the BaO layer provides an isolation layer between the waveguide and the silicon substrate. For practical use of such a multilayer structure, the optical loss from the waveguide layer should be less than about 1 dB/cm. Therefore and in accordance with calculations of the optical loss of such a multilayer structure, BaO thicknesses of greater than about 500 nm are required. However, if the BaO layer is as thick as 1000 nm, then the guiding layer may be as thin as about 200 nm. Such film thicknesses ar easily achievable by appropriately controlling the exposure of the silicon substrate to the various elements in accordance with the principles of the process of the present invention.

It will be understood that numerous modifications and substitutions can be had to the aforedescribed embodiments without departing from the spirit of the invention. For example, although the aforedescribed process has been described for growing BaO upon a silicon surface and then growing BaTiO$_3$ upon the BaO-covered surface, the principles of the present invention may be utilized to grow any of a number of epitaxial oxides upon a silicon substrate wherein the oxide has a sodium chloride-type lattice structure. Such oxides, other than BaO, include MgO, CaO, and SrO. As is the case with barium of the aforementioned process involving BaO, magnesium, calcium and strontium of the compounds MgO, CaO and SrO, respectively, each react with the silicon of the silicon substrate during the high temperature deposition step to form a silicide at the metal/silicon interface. Although each of these oxides include a lattice structure suitable for matching with that of the silicon at the silicon surface, BaO may be preferred over the others if an anatomically sharp crystalline interface is desired due to the close lattice match between BaO and Si. Moreover, once an epitaxial oxide has been grown upon the silicon surface, any of a number of oxides known as perovskites may be grown as epitaxial thin films upon the oxide layer. In this connection, the choice of Perovskite grown upon the underlying oxide may be selected for the lattice match therebetween. Accordingly, the aforedescribed embodiments are intended for the purpose of illustration and not as limitation.

We claim:

1. A process for growing an epitaxial oxide having a sodium chloride-type lattice structure onto a silicon substrate comprising the steps of:

developing an ultra high vacuum, oxygen-free environment about a silicon substrate having a surface which has been cleaned to atomic cleanliness and raised to a high temperature;

depositing an amount of a metal from a flux source of the metal upon the substrate surface until a fraction of a monolayer of the metal covers the substrate surface while maintaining the environment of the silicon substrate oxygen-free and at a high temperature so that the metal and the silicon of the substrate react to form a submonolayer of a silicide which is epitaxially matched to that of silicon at the metal/silicon interface;

lowering the temperature of the substrate to between about 200° C. and 300° C.;

depositing an additional amount of the metal from the flux source upon the substrate surface until the substrate surface is covered by about one monolayer of the metal;

without exposing the metal-covered surface, raising the pressure of the high vacuum environment to a target pressure between about $1\times10^{-6}$ torr and $5\times10^{-6}$ torr with the introduction of oxygen and introducing an additional amount of the metal from the flux source into the high vacuum environment necessary to deposit the metal upon the substrate surface at a relatively slow rate;

upon reaching the target pressure, exposing the metal-covered surface to the oxygen and metal within the high vacuum environment so that epitaxial oxide begins to grow upon the substrate surface; and building up the epitaxial oxide upon the substrate in a layered fashion by cyclically exposing the metal-covered substrate surface to additional amounts of the metal from the flux source and oxygen.

2. The process as defined in claim 1 wherein the metal is chosen rom a group consisting of magnesium, calcium, strontium, and barium.

3. The process as defined in claim 1 wherein the metal is barium.

4. The process as defined in claim 3 wherein the fraction of the metal monolayer deposited upon the substrate surface in the first depositing step is about one-fourth.

5. The process as defined in claim 1 wherein the step of exposing includes a step of raising the temperature of the substrate to about 900° C. following the build-up of a few monolayers of the formed oxide over the metal-covered substrate surface.

6. The process as defined in claim 1 wherein the step of exposing is followed by a step of exposing the oxide-covered substrate surface with metal constituents of a perovskite so that the perovskite grows epitaxially upon the oxide-covered substrate surface.

7. The process as defined in claim 6 wherein the step of exposing the oxide-covered substrate surface includes a step of introducing an amount of each metal constituent of the perovskite in an alternating fashion to the substrate surface in the presence of oxygen.

8. A structure formed by the process of claim 1.

9. A process for growing an epitaxial oxide having a sodium chloride-type lattice structure onto a silicon substrate comprising the steps of:

developing an ultra high vacuum, oxygen-free environment about a silicon substrate having a surface which has been cleaned to atomic cleanliness and raised to a temperature of between about 850° and 1050° C.;

while maintaining the oxygen-free environment of the substrate and maintaining the temperature of the substrate at no less than about 850° C., depositing a metal from a flux source of the metal upon the clean substrate surface until a fraction of a monolayer of the metal covers the substrate surface and so that the metal and the silicon of the substrate react to form a submonolayer of a silicide at the metal/silicon interface wherein the submonolayer of silicide is epitaxially matched to silicon;

lowering the temperature of the substrate to between about 200° and 300° C.;

depositing an additional amount of the metal from the flux source upon the substrate until the substrate surface is covered by about one monolayer of the metal;

without exposing the metal-covered surface, raise the pressure of the high vacuum environment to a target pressure between about $1\times10^{-6}$ torr and $5\times10^{-6}$ torr with the introduction of oxygen and introducing an additional amount of the metal from the flux source into the high vacuum environment needed to deposit the metal upon the substrate surface at a rate between about 0.01 nm/sec and 0.05 nm/sec.

upon reaching the target pressure, exposing the metal-covered surface to the oxygen and metal within the high vacuum environment so that epitaxial oxide begins to grow upon the substrate surface; and building up the epitaxial oxide upon the substrate surface in a layered fashion by cyclically exposing the metal-covered substrate surface to additional amounts to the metal from the flux source and oxygen.

10. The process as defined in claim 9 wherein the metal is chosen from a group consisting of magnesium, calcium, strontium, and barium.

11. The process as defined in claim 9 wherein the metal is barium.

12. The process as defined in claim 11 wherein the fraction of the metal monolayer deposited upon the substrate surface in the first depositing step is about one-fourth.

13. The process as defined in claim 9 wherein the step of exposing includes a step of raising the temperature of the substrate to about 900° C. following the build-up of a few monolayers of the formed oxide over the metal-covered substrate surface.

14. The process as defined in claim 9 wherein the step of exposing is followed by a step of exposing the oxide-covered substrate surface with metal constituents of a perovskite so that the perovskite grows epitaxially upon the oxide-covered substrate surface.

15. A structure formed by the process of claim 9.

16. A structure including a substrate of silicon, the improvement comprising:

a submonolayer of silicide covering a surface of the silicon substrate wherein the silicide is epitaxially matched to silicon;

a monolayer of a metal epitaxially covering the surface of the silicon substrate and the submonolayer of silicide; and a film of oxide epitaxially covering the metal-covered substrate surface wherein the film includes additional layers of the metal combined with oxygen.

17. The improvement of claim 16 wherein the metal is chosen from a group consisting of magnesium, calcium, strontium and barium.

18. The improvement of claim 16 further comprising a layer of a perovskite epitaxially covering the oxide film which covers the metal-covered substrate surface.

19. The improvement of claim 18 wherein the metal is barium and the perovskite is $BaTiO_3$.

* * * * *